United States Patent
Yun et al.

(10) Patent No.: US 6,939,807 B2
(45) Date of Patent: Sep. 6, 2005

(54) APPARATUS FOR MANUFACTURING SEMICONDUCTOR DEVICES WITH A MOVEABLE SHIELD

(75) Inventors: Gwang-Ui Yun, Cheonan-shi (KR); Jae-Sun Han, Cheonan-shi (KR)

(73) Assignee: Semes Co., Ltd., Chonan-Shi (KR)

( * ) Notice: Subject to any disclaimer, the term of this patent is extended or adjusted under 35 U.S.C. 154(b) by 0 days.

(21) Appl. No.: 10/631,764

(22) Filed: Aug. 1, 2003

(65) Prior Publication Data

US 2004/0077159 A1 Apr. 22, 2004

(30) Foreign Application Priority Data

Oct. 17, 2002 (KR) .................................. 10-2002-0063490

(51) Int. Cl.[7] .......................... H01L 21/302; B44C 1/22
(52) U.S. Cl. ........................................ 438/704; 216/92
(58) Field of Search .......................... 438/704; 216/92, 216/91

(56) References Cited

U.S. PATENT DOCUMENTS 6,123,865 A * 9/2000 Lin et al. ....................... 216/91
6,733,686 B2 * 5/2004 Hata ............................ 216/91

FOREIGN PATENT DOCUMENTS

| JP | 10-214023 | 8/1989 | |
| JP | 07-020623 | * 1/1995 | ............ G03F/1/08 |
| JP | 10-189421 | 7/1998 | |
| JP | 10-199778 | 7/1998 | |
| KR | 1999-18792 | 6/1999 | |

* cited by examiner

Primary Examiner—W. David Coleman
(74) Attorney, Agent, or Firm—Harness, Dickey & Pierce, PLC

(57) ABSTRACT

An apparatus for manufacturing semiconductor devices includes a supporter portion on which a semiconductor substrate is placed, a nozzle portion for injecting a fluid to an edge of the substrate placed on the supporter portion, a shielding cover for preventing the fluid injected from the nozzle portion from flowing to a shielding portion among a pattern-formed portion, and a shielding cover moving portion device for moving the shielding cover up and down. The apparatus makes it possible to prevent a chemical solution injected to the edge of a wafer from flowing to a shielding portion of the wafer when the wafer edge is etched.

20 Claims, 10 Drawing Sheets

APPARATUS FOR MANUFACTURING SEMICONDUCTOR DEVICES WITH A MOVEABLE SHIELD

FIELD OF THE INVENTION

The present invention relates to an apparatus for manufacturing semiconductor devices and, more particularly, to an etching apparatus for etching a pattern-formed portion except a predetermined region of a semiconductor substrate.

BACKGROUND OF THE INVENTION

In fabrication of semiconductor devices, a plurality of layers (e.g., a polysilicon layer, an oxide layer, a nitride layer, a metal layer, etc.) are formed on a wafer used as a semiconductor substrate. A photoresist layer is coated on the layer. By an exposure process, a pattern formed on a photomask is transcribed onto the photoresist layer. By an etching process, a desirable pattern is then formed on the wafer.

Layers or photoresist remains at the edge of the wafer where these processes are carried out. In this case, if the wafer is held and transported to a different process, the remaining layers are spattered. Since they act as particles to reduce a yield, there is a need for an etching process to remove the remaining layers or photoresist.

Conventionally, a wafer edge is etched by the following manner. Except a wafer edge to be etched, a top surface of a pattern-formed wafer is shielded by a shielding solution or a mask. Thereafter, an etchant is sprayed onto the wafer or the wafer is submerged into a bath in which an etchant is contained. This manner needs steps of shielding a pattern-formed portion by a shielding solution or a mask and removing the shielding solution or the mask. Accordingly, a long work time is required and a large amount of the etchant is consumed.

SUMMARY OF THE INVENTION

The present invention provides an apparatus for manufacturing semiconductor devices. A feature of the apparatus is to fast and readily etch only a wafer edge to be etched among a top surface of a wafer. Another feature of the apparatus is to readily regulate an etch width of a wafer edge.

In order to achieve these features, the present invention provides an apparatus for fabricating semiconductor devices. The apparatus includes a supporter portion on which a semiconductor substrate is placed, a nozzle portion for injecting a fluid onto an edge of the substrate attached to the supporter portion, and a movable shielding cover for preventing the fluid injected from the nozzle portion from flowing to a shielding portion among a pattern-formed portion.

The supporter portion includes a chuck, a chuck rotating portion for rotating the chuck, and chucking pins for fixing the wafer edge and preventing the substrate from dropping out from the chuck when the supporter portion is rotated.

The fluid injecting portion has a fluid injecting hold formed in the center of the chuck and a clued supply pipe which supplies a fluid supplied from the fluid injecting hold and is disposed in the chuck supporter.

The shielding cover has a gas injecting portion which is spaced apart from the shielding portion and injects a gas so as to prevent the fluid injected from the substrate edge from flowing to the shielding portion of the substrate.

The shielding cover has a lower portion facing the shielding portion of the substrate. The lower portion of the shielding cover includes a protrusion disposed at a portion corresponding to an edge of the shielding portion a parallel portion disposed in the protrusion, and an inclined portion disposed between the parallel portion and the protrusion.

The gas injecting portion includes a gas injecting hole disposed at the center of the parallel portion and a gas supply pipe acting as a path of the gas supplied to the gas injecting hole.

The nozzle portion includes a nozzle, a fluid supply pipe acting as a path of the fluid supplied to the nozzle, and a nozzle moving portion for moving the nozzle. The nozzle is inclined outwardly toward the substrate from a shaft which is perpendicular to the top surface of the substrate In one embodiment, the nozzle moving portion includes a motor, a pulley spaced apart from the motor, a belt which covers the motor and the pulley and moves as long as a predetermined distance together by the rotation of the motor, brackets which are connected to both sides of the belt and move together with the belt, and nozzle supporters which are coupled to the brackets respectively and support the two nozzles respectively In another embodiment, the nozzle moving portion includes a motor, a pinion which is connected to a pivot of the motor, a rack portion which engages with screw threads of the pinion, and nozzle supporters which support the nozzles respectively.

The shielding cover moving portion includes a shielding cover supporter for supporting the shielding cover, a moving rod which is connected to the shielding cover supporter and moves up and down together with the shielding cover supporter, and a driving portion for moving the moving rod.

DESCRIPTION OF THE PREFERRED EMBODIMENT

The present invention will now be describe more fully hereinafter with reference to the accompanying drawings, in which preferred embodiments of the invention are shown. Like numbers refer to like elements throughout.

In the present invention, a top surface of a wafer means a surface on which a pattern is formed, and a bottom surface thereof means an opposite surface to the top surface. Further, a shielding portion means a wafer top surface except a wafer edge where incomplete chips are disposed and is shielded from a chemical solution injected to the edge.

Although an etching apparatus will be exemplarily described in these embodiments, it may be applied to all semiconductor manufacturing apparatuses injecting a chemical solution only onto a wafer edge or a wafer lower portion.

Figure 1:
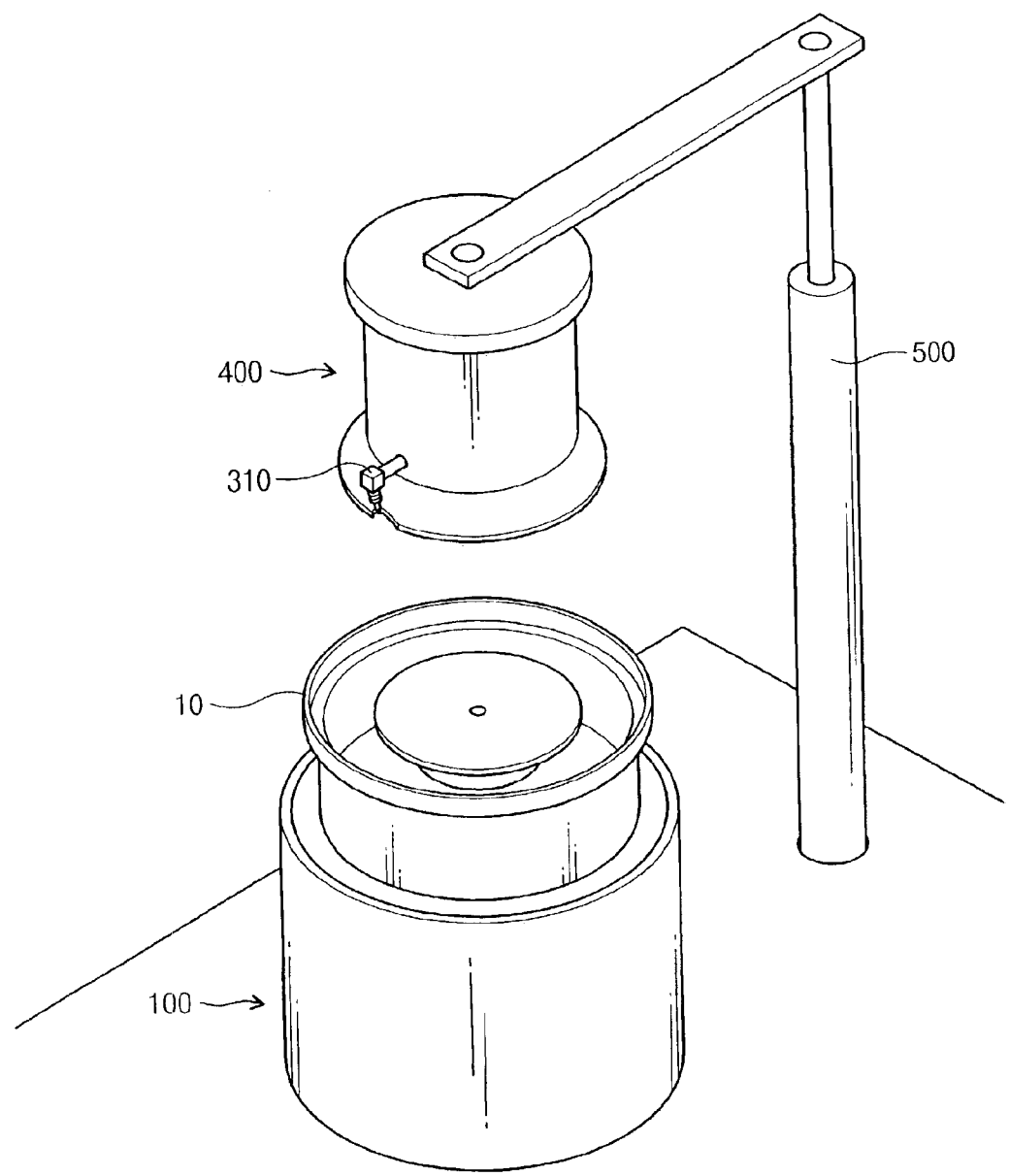
FIG. 1 is a perspective view of an etching apparatus according to an embodiment of the present invention.
Figure 2:
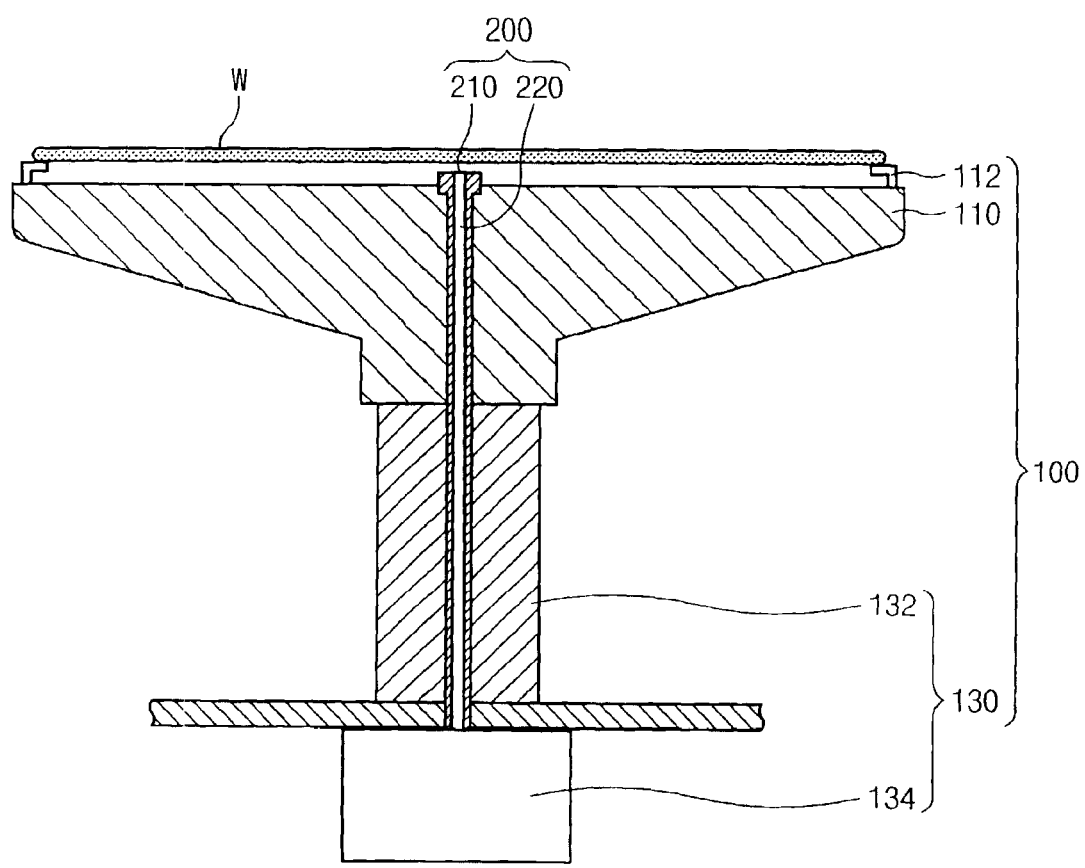
FIG. 2 is a cross-sectional view of a supporter portion and a fluid injecting portion.

A perspective view of an etching apparatus according to an embodiment of the present invention is illustrated in FIG. 1, and a supporter portion and a fluid injecting portion of FIG. 1 are illustrated in FIG. 2.

Referring to FIG. 1 and FIG. 2, an etching apparatus includes a bowl 10, a supporter portion 100, a fluid injecting portion 200, a nozzle portion 300, a shielding cover 400, and a shielding cover moving portion 500.

The supporter portion 100 is a place where an etching process is carried out, and has a chuck 110, chucking pins 112, and a chuck rotating portion 130. During the etching process, a wafer is spaced apart from the chuck 110. To prevent the wafer from dropping out from the chuck 110, a plurality of chucking pins 112 are installed at the edge of the chuck 110.

During the etching process, the chuck 110 is rotated by means of the chuck rotating portion 130. The chuck rotating portion 130 includes a chuck supporter 132 for supporting the chuck 110 and a chuck driving portion 134 for rotating the chuck supporter 132.

In the supporter 110, the fluid injecting portion 200 is disposed to etch a lower portion of the wafer. The fluid injecting portion 200 has a fluid nozzle 210 and a fluid supply pipe 220. The fluid nozzle 210 is disposed at the center of the chuck 110, and the fluid supply pipe 220 is disposed at the center of the inside of the chuck supporter 132 and the chuck 110. Accordingly an etchant, which is supplied from an etchant storing portion (not shown) through the fluid supply pipe 220, is injected to a space between a surface of the chuck 110 and the wafer lower portion.

The supporter portion 100 is disposed in the bowl 10. The bowl 10 has an opened upper portion and surrounds a circumference of the supporter portion 100 so as to prevent an etchant injected from splashing out during the etching process.

The portion 300 injects an etchant to the edge of a wafer on which the chuck 110 is placed. The shielding cover 400 shields the shielding side of the wafer from the etchant injected from the nozzle portion 300.

Figure 3:
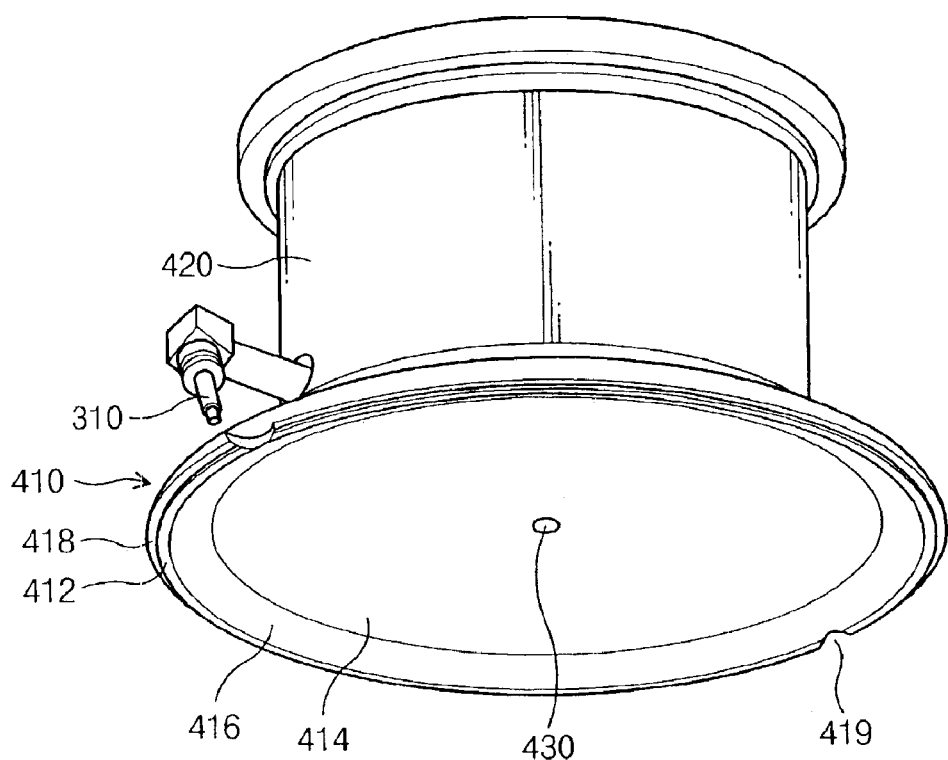
FIG. 3 is a perspective view of a shielding cover shown in FIG. 1.

A perspective view of the shielding cover of FIG. 2 is illustrated in FIG. 3. One embodiment of a nozzle moving portion of FIG. 3 is now explained below with reference to FIG. 4.

Figure 4:
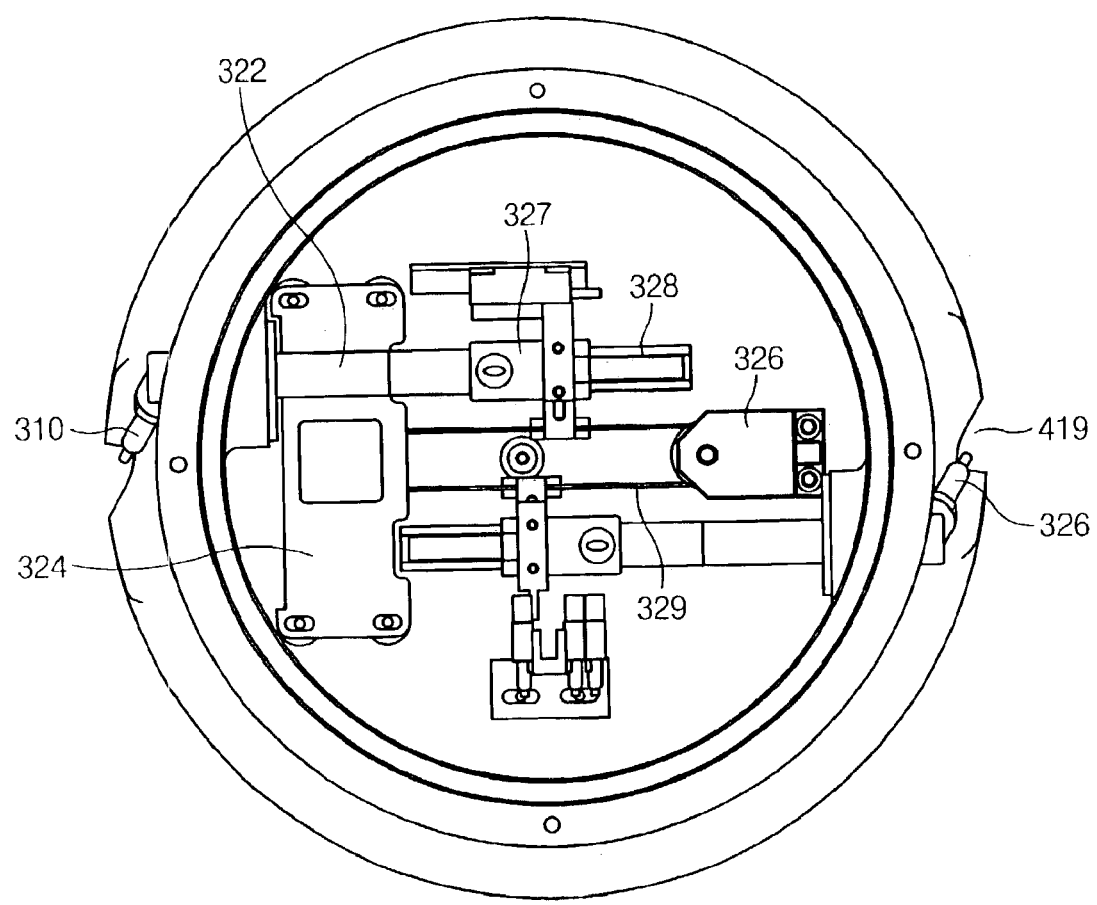
FIG. 4 is a diagram showing an embodiment of a nozzle moving portion.

Referring to FIG. 4, the nozzle portion 300 includes a nozzle 310, a chemical solution supply pipe, and a nozzle moving portion.

The nozzle 310 is disposed against a wafer edge and is supported by a later-described nozzle supporter 322. Further, the nozzle 310 is disposed away from the center of the wafer and is inclined with a predetermined angle relative to rotation direction of the wafer. Accordingly, an injection solution injected from the nozzle 310 flows to the outside of the wafer. The injection solution is supplied from an external etchant storing unit (not shown) through a chemical solution supply pipe. In this embodiment, the chemical solution supply pipe is disposed in the nozzle supporter 322.

The nozzle 310 horizontally moves to adjust the width of an etched wafer edge. For this, the nozzle portion 300 includes a nozzle moving portion for moving the nozzle 310. Preferably, the nozzle moving portion is disposed in a housing 420 of a later-described shielding cover 400 not to be exposed to the outside.

As shown in FIG. 4, the nozzle moving portion includes a nozzle supporter 322, a nozzle driving portion 324, a pulley 326, a bracket 327, a guide rail 328, and a belt 329. The nozzle supporter 322 supports the nozzle 310, and the guide rail 328 guides the nozzle 322 such that the nozzle 322 correctly moves in a horizontal direction.

The nozzle driving portion 324 is disposed at one side of the inside of the housing 420, and the pulley 326 is disposed to be opposite to the nozzle driving portion 324. The nozzle driving portion 324 and the pulley 326 are connected by the belt 329. That is, the belt 329 moves with a predetermined distance by the nozzle driving portion 324. The guide rails 328, which are parallel with the belt 329, are disposed at both sides of the belt 329. The bracket 322 connected with the nozzle supporter 322 is disposed on the respective guide rails 328. One end of the bracket 327 is connected with the belt 329. While the belt 329 moves, the bracket 327 connected with the nozzle supporter 322 horizontally moves on the guide rail 328.

Preferably, the nozzle driving portion 324 employs a stepping motor for precisely moving the nozzle with a predetermined space. However, the nozzle driving portion 324 may employ a typical driving portion such as a pneumatic or hydraulic cylinder.

Figure 5:
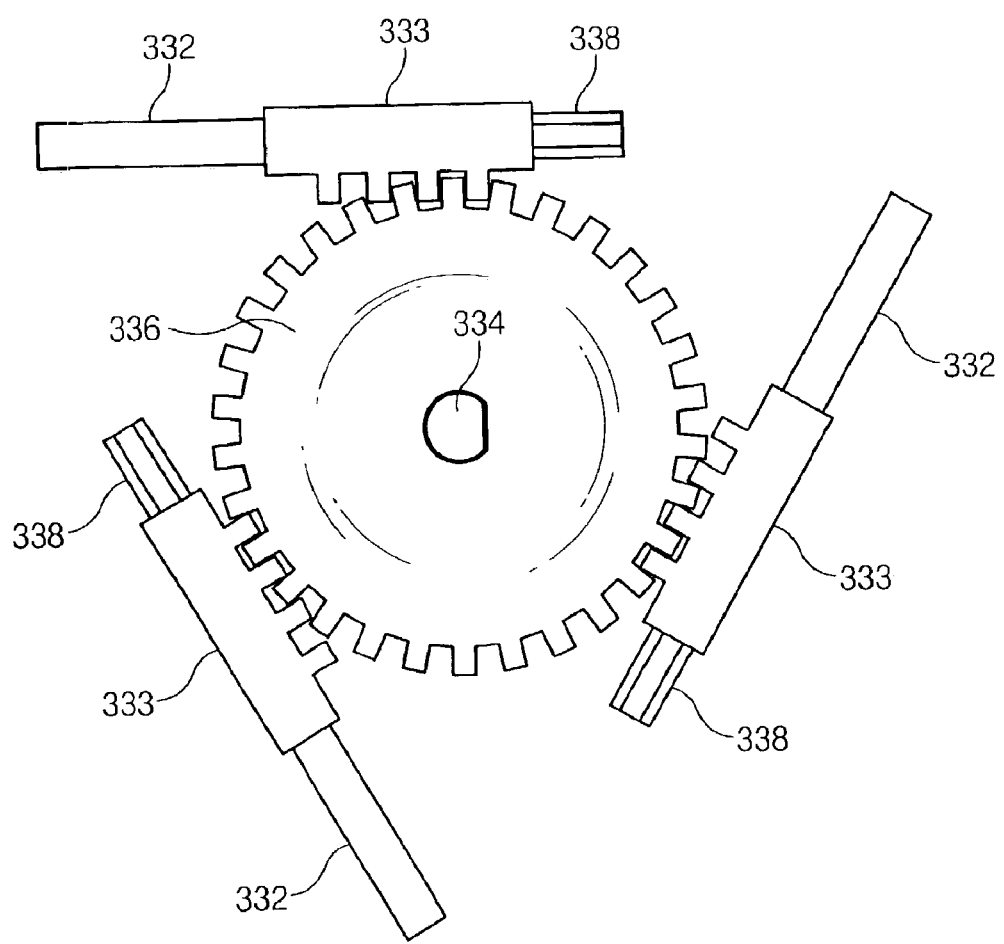
FIG. 5 is a diagram showing another embodiment of the nozzle moving portion.

Another embodiment of the nozzle driving portion according to the invention is illustrated in FIG. 5. Referring to FIG. 5, the nozzle driving portion includes a stepping motor 334, a pinion 336, a nozzle supporter 332, and guide rails 338.

The pinion 336 is connected with a rotation pivot of the stepping motor 334 to be horizontally disposed, and rotates together with the stepping motor 334. A plurality of nozzle supporters 332 are constantly spaced at the circumference of the pinion 336. The nozzle supporter 332 has a rack portion 333 where screw threads are formed such that the rack portion 333 engages with a screw thread of the pinion 336. Similar to the first embodiment, the nozzle 310 is coupled to the other side of the nozzle supporter 332.

The etching apparatus of this invention includes two nozzles 310 or three. In accordance with an embodiment, the same chemical solution is simultaneously supplied to the nozzles 310. The chemical solution is injected from the nozzles 310 to a wafer edge to shorten time required for an etching process. Preferably, the nozzles 310 are constantly spaced at the wafer edge.

According to the present invention, one driving portion may horizontally move the nozzle supporters 322 and 331 with a constant space at the same time. Thus, although a plurality of nozzles 310 are used, a wafer edge may be etched with a constant width.

When a plurality of chemical solutions are sequentially supplied, if the etching apparatus has one chemical solution supply pipe and one nozzle 310, the pipe and nozzle must be cleaned whenever different kinds of chemical solutions are supplied. To shorten time required for cleaning the pipe and nozzle, different kinds of chemical solutions may be supplied to the nozzles.

Although the nozzle portion 300 has two or three nozzles 310 for injecting the same chemical solution or different chemical solutions, it may have one nozzle or four nozzles or more.

Since the etching apparatus has a plurality of nozzles 310 each being movable in a horizontal direction, it can perform an etching process at a higher speed than a conventional etching apparatus and a width of a wafer edge to be etched can readily be adjusted.

The etching apparatus includes a shielding cover 400 for preventing a chemical solution injected from the nozzle 310 from flowing to a shielding side of the wafer.

Figure 6:
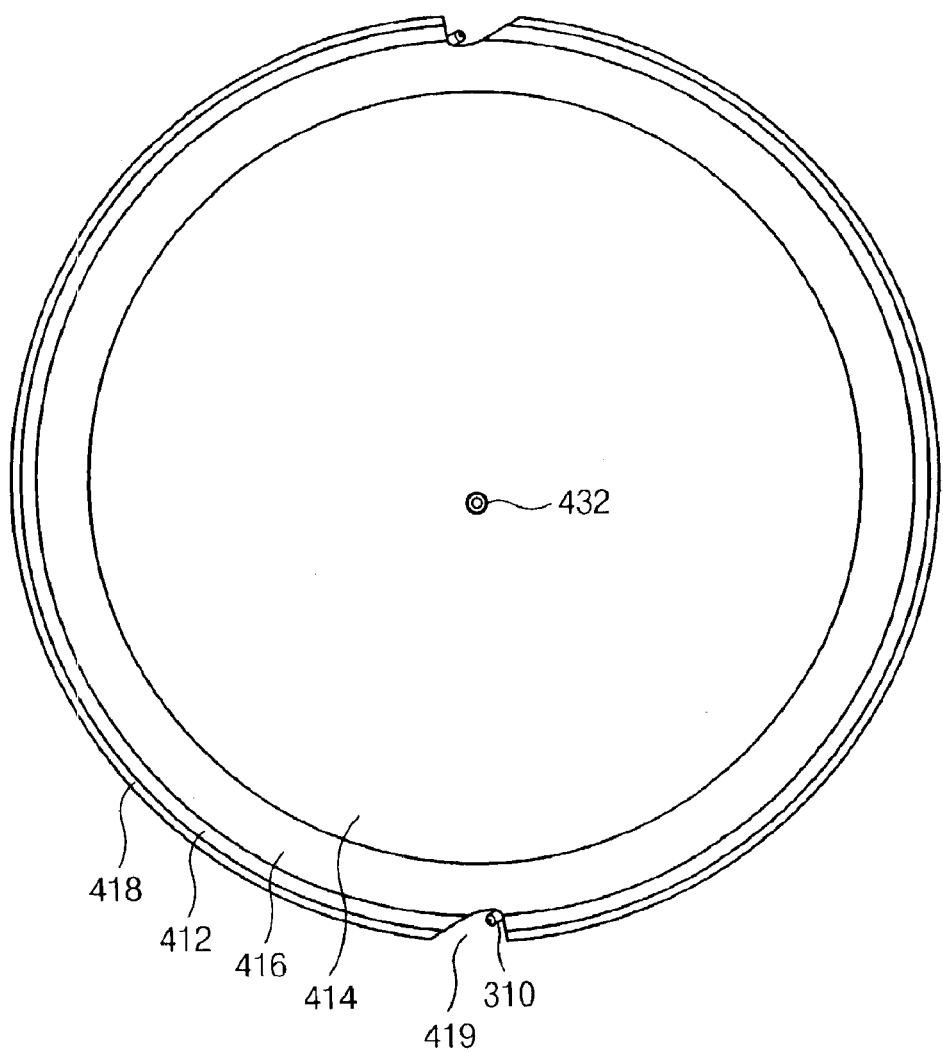
FIG. 6 is a bottom view of a shielding cover.
Figure 7:
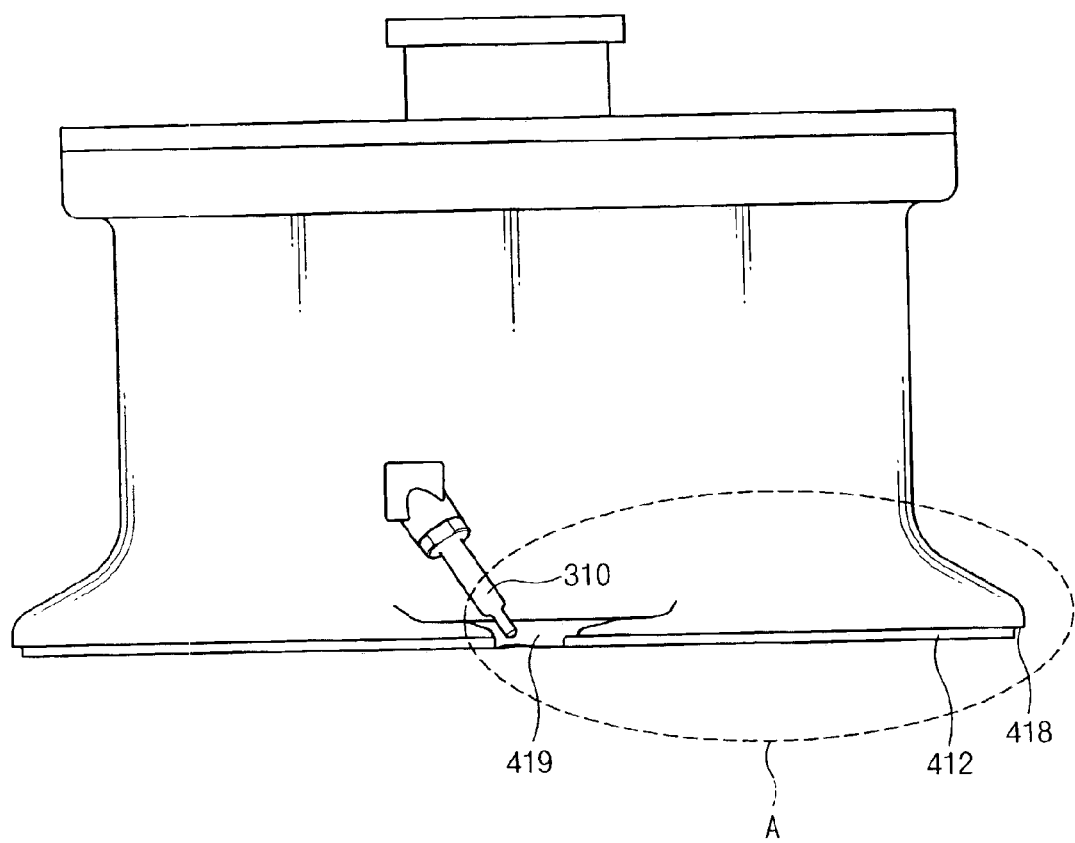
FIG. 7 is a side view of the shielding cover.
Figure 8:
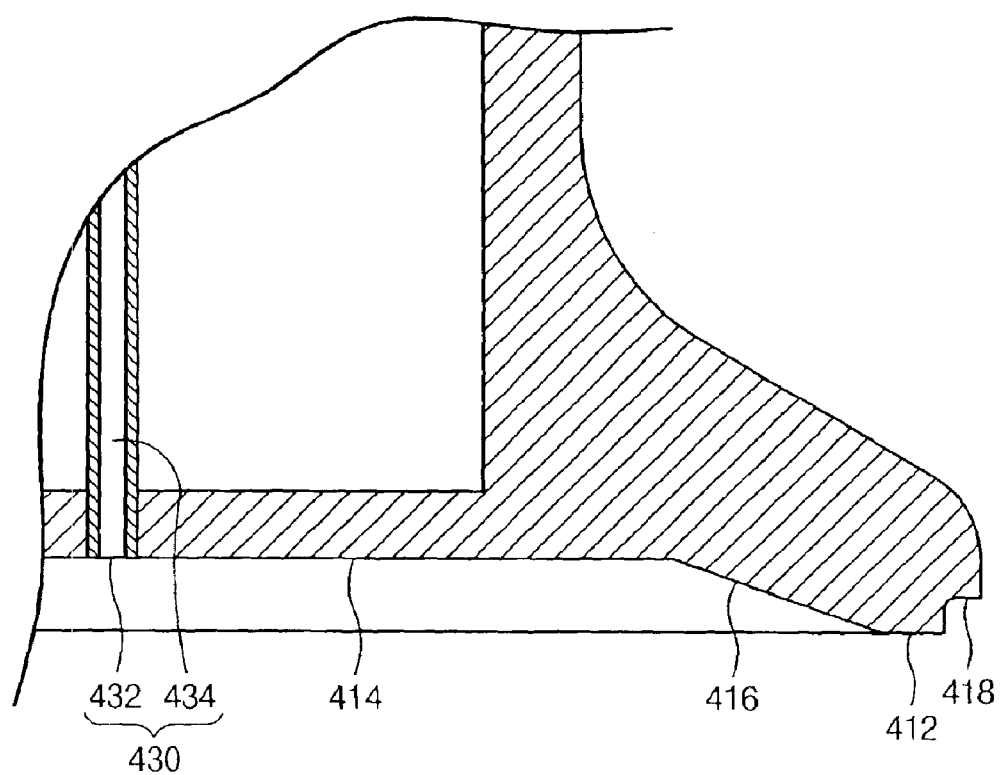
FIG. 8 is an enlarged view of a section 'A' shown in FIG. 7.
Figure 9:
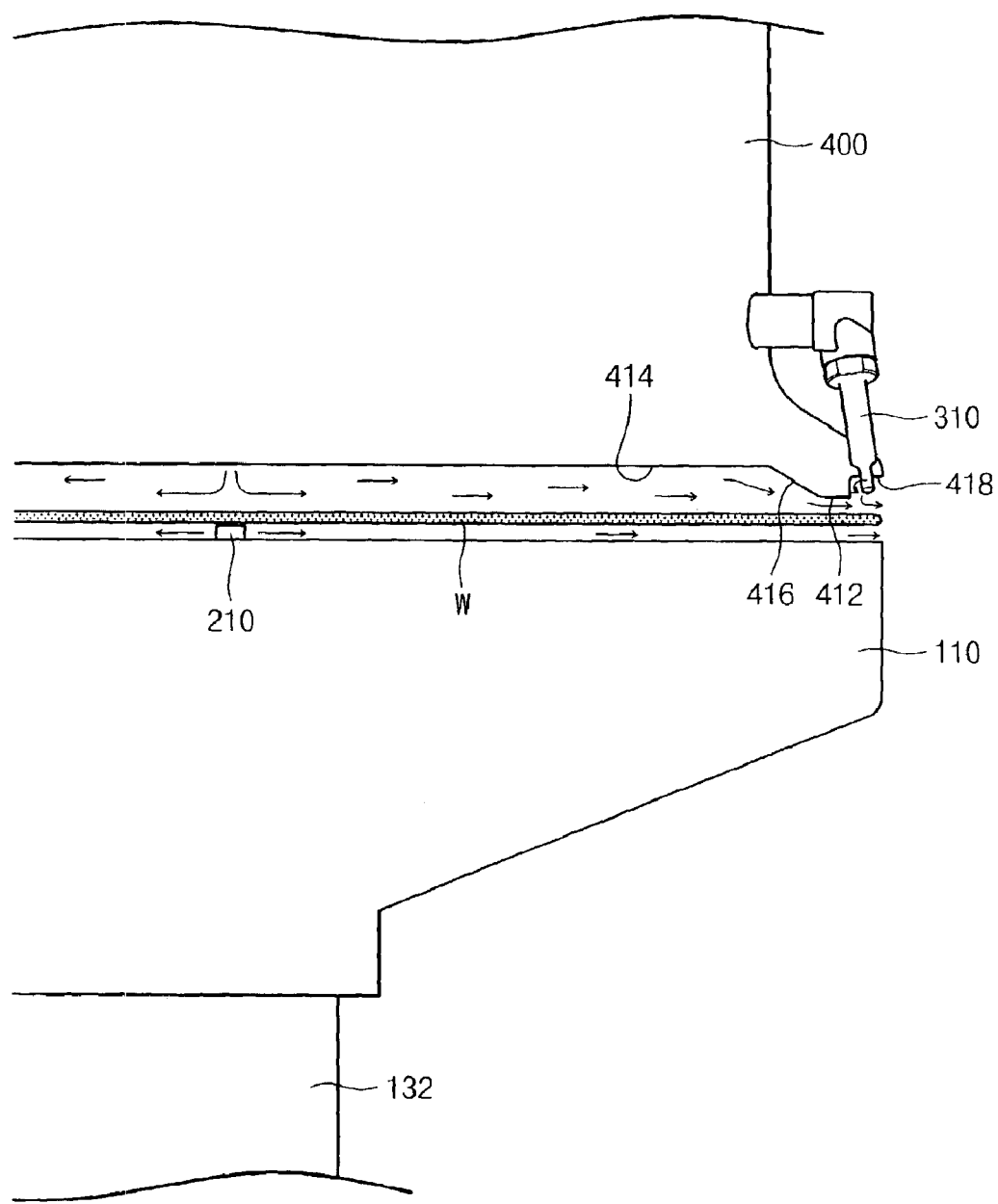
FIG. 9 is an outline view showing the flow of an etchant and a nitrogen gas in the present invention.

A bottom view and a side view of the shielding cover 400 of FIG. 3 are illustrated in FIG. 6 and FIG. 7, respectively. An enlarged view of a lower portion of the shielding cover 400 is illustrated in FIG. 8.

Referring to FIG. 2 and FIG. 6 through FIG. 8, the shielding cover 400 includes a lower portion 410, a housing 420, and a gas injecting portion 430. The lower portion is disposed against an upper portion of the wafer during an etching process and has a protrusion 412, a parallel portion 414, an inclined portion 416, and a cover portion 418. The protrusion 412 is opposite to the edge of a wafer shielding portion and has a ring shape. The parallel portion 414 is a flat portion disposed inside the protrusion 412.

During an etching process, the lower portion 410 is spaced apart from the upper portion of the wafer. Accordingly, the protrusion 412 does not contact the wafer-upper portion to prevent an etchant injected to the wafer edge from flowing to the wafer shielding portion.

The gas injecting portion 430 includes a gas injecting hole 432 formed in the center of the parallel portion 414 and a gas supply pipe 434 disposed in the later-described housing 420. The gas supply pipe 434 acts as a path for supplying a gas to the gas injecting hole 432.

The inclined portion 416 is disposed between the parallel portion 414 and the protrusion 412 and is inclined in section or has a predetermined radius of curvature. Accordingly, a gas injected to a space between the parallel portion 414 and the wafer upper portion may flow to a space between the protrusion 412 and the wafer upper portion without making a vortex.

The cover portion 418 is disposed outside the protrusion 412 and prevents a chemical solution injected from the nozzle 310 to the wafer edge from splashing over.

Assuming that distances between the wafer upper portion and the parallel portion 414, the protrusion 412, and the cover portion 418 are referred to as A, B, and C respectively, it is preferable that B<C≦A. Specifically, it is preferable that 1 mm<A<5 mm, 1 mm≦B≦3 mm, and 1 mm<C≦5 mm.

A nitrogen gas, which is injected to the space between the parallel portion 414 and the wafer upper portion through the gas injecting hole 432, flows from a narrow space below the protrusion 412 to a wide space below the cover portion 418 that is temporarily extended. Accordingly, a high pressure is generated under the cover portion 418 and a vortex occurs at an angular part, as shown in FIG. 8. The vortex prevents the chemical solution splashing from the bowl 10 and the nozzle 310 and particles from contacting the wafer shielding portion.

The cover portion 418 has the same number of grooves 419 as the nozzles 310. The nozzle 310 is inserted into the groove 419 and is movable with an etch width required in the groove.

The etching apparatus of this invention includes the shielding cover moving portion 500 for moving the shielding cover 400 up and down.

Figure 10:
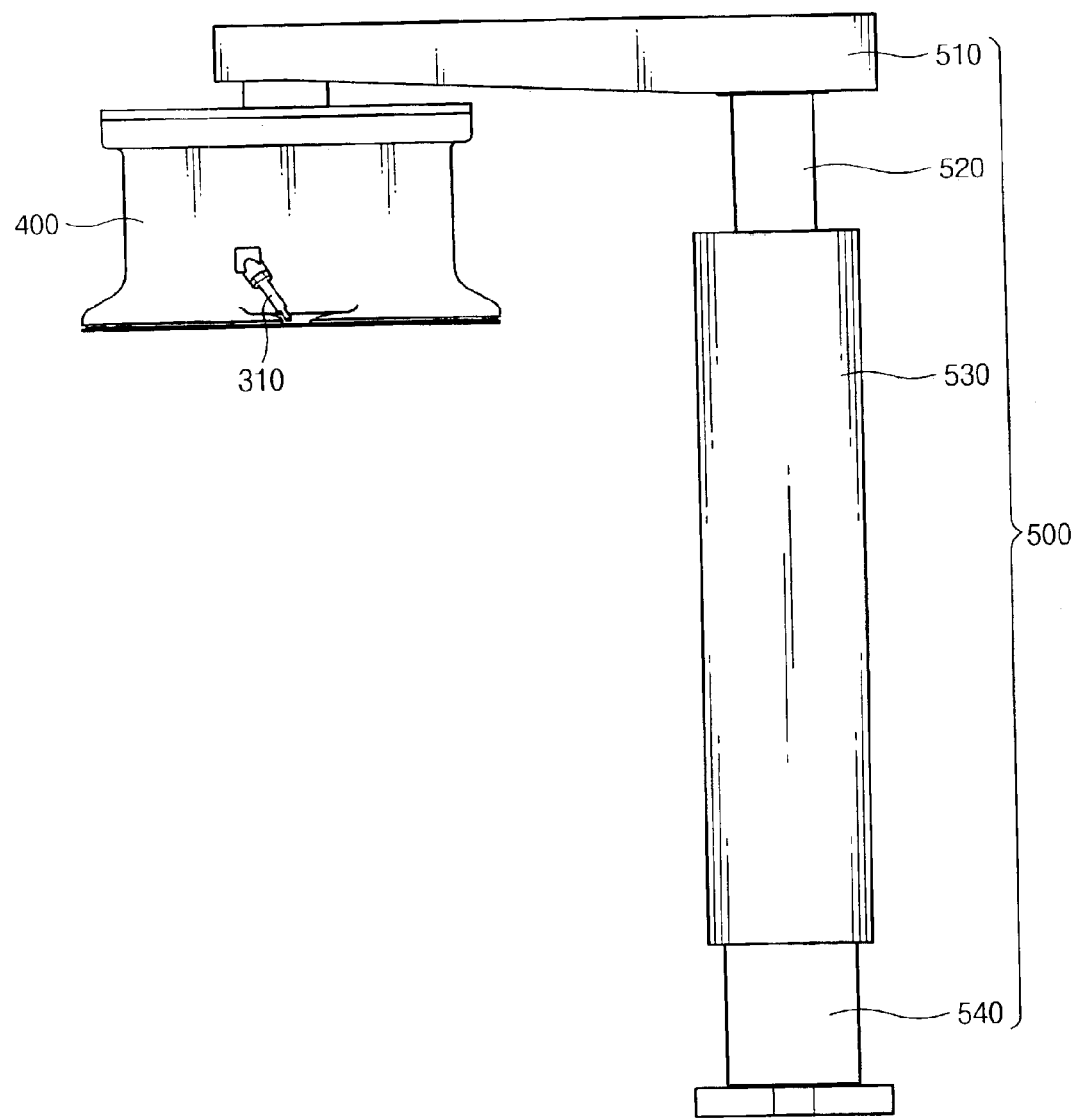
FIG. 10 is a side view of a nozzle driving portion.

A front view of the shielding cover moving portion 500 is illustrated in FIG. 10. Referring to FIG. 10, the shielding cover moving portion 500 includes a shielding cover supporter 510, a moving rod 520, a moving rod guide 530, and a shielding cover driving portion 540. The shielding cover supporter 510 supports the shielding cover 400. The housing 420 of the shielding cover 400 is connected to a bottom side of one end of the shielding cover supporter 510. The other end of the shielding cover supporter 510 is connected to the moving rod 520. The moving rod 520 moves the shielding cover supporter 510 up and down and is driven by the shielding cover driving portion 540 such as a motor or a pneumatic or hydraulic cylinder. The moving rod guide 530 guides the up-down movement of the moving rod 520 so that the moving rod 520 can precisely move vertically.

Since the etching apparatus includes a shielding cover which can move up and down, it is not necessary to cover an unetched section with a mask or a shielding solution when only a wafer edge is etched. Therefore, the etching process can be conducted at a high speed.

Now, an etching process using the etching apparatus according to the invention is explained below in detail.

The shielding cover 400 moves up by means of the shielding cover moving portion 500. A wafer subjected to an etching process is loaded on the chuck 110 by means of a transport robot (not shown). The shielding cover moves so that the wafer upper portion and the lower portion 410 of the shielding cover 400 are maintained with a predetermined space. The nozzle 310 horizontally moves by means of the nozzle moving portion according to an etch width. The chuck 110 is rotated, and a nitrogen gas is injected from the gas injecting portion 430. An etchant is injected from the nozzle 310 to the wafer edge. Afterwards, the etchant is injected to the wafer lower portion through the fluid injecting hole 210 formed in the center of the chuck 110. When the etching process is completed, the shielding cover 400 moves up and the wafer is unloaded. A next wafer is loaded on the chuck 110.

While preferred embodiments have been shown and described, various modifications and substitutions may be made thereto without departing from the spirit and scope of the present invention. Accordingly, it is to be understood that the present invention has been described by way of illustrations and not limitation.

What is claimed is:

1. An apparatus for fabricating semiconductor devices, comprising:
   a supporter portion on which a semiconductor substrate is placed;
   a nozzle portion for injecting a fluid onto an edge of the substrate attached to the supporter portion; and
   a movable shielding cover for preventing the fluid injected from the nozzle portion from flowing to a shielding portion among a pattern-formed portion,
   wherein the nozzle portion includes:
   a nozzle;
   a fluid supply pipe acting as a path of the fluid supplied to the nozzle; and
   a nozzle moving portion for moving the nozzle.

2. The apparatus as set forth in claim 1, wherein the shielding is spaced apart from the shielding portion of the substrate during a process and the shielding cover has a gas injecting portion which injects a gas so as to prevent the fluid injected on the edge of the substrate from flowing to the shielding portion of the substrate.

3. The apparatus as set forth in claim 2, wherein the shielding cover has a lower portion which faces the shielding portion of the substrate and has a protrusion disposed at a portion corresponding to an edge of the shielding portion.

4. The apparatus as set forth in claim 3, wherein the lower portion of the shielding cover further has a parallel portion disposed in the protrusion and an inclined portion disposed between the parallel portion and the protrusion.

5. The apparatus as set forth in claim 4, wherein the gas injecting portion includes:
   a gas injecting hole disposed at the center of the horizontal portion; and
   a gas supply pipe acting as a path of the gas supplied to the gas injecting hole.

6. The apparatus as set forth in claim 1, wherein the nozzle is inclined outwardly toward the substrate from a shaft which is perpendicular to the top surface of the substrate.

7. The apparatus as set forth in claim 1, wherein the nozzle moving portion includes:
   a nozzle supporter for supporting the nozzle; and
   a nozzle driving portion for horizontally moving the nozzle supporter.

8. The apparatus as set forth in claim 7, wherein the nozzle moving portion further includes a guide for guiding the horizontal movement of the nozzle supporter.

9. The apparatus as set forth in claim 1, wherein the nozzle portion includes:
   a plurality of nozzles constantly spaced at the substrate edge;
   fluid supply pipes each acting as a path of the fluid supplied to the respective nozzles; and
   a nozzle moving portion for horizontally moving the respective nozzles.

10. The apparatus as set forth in claim 9, wherein the nozzle moving portion includes:
    a motor;
    a pulley spaced apart from the motor;
    a belt which covers the motor and the pulley and moves as long as a predetermined distance together by the rotation of the motor;
    brackets which are connected to both sides of the belt and move together with the belt; and
    nozzle supporters which are coupled to the brackets respectively and support the two nozzles respectively.

11. The apparatus as set forth in claim 1, further comprising a shielding cover moving portion for moving the shielding cover, wherein the shielding cover moving portion includes:
    a shielding cover supporter for supporting the shielding cover;
    a moving rod which is connected to the shielding cover supporter and moves up and down together with the shielding cover supporter; and
    a driving portion for moving the moving rod.

12. The apparatus as set forth in claim 11, further comprising a moving rod guide for guiding the up-and-down movement of the moving rod.

13. The apparatus as set forth in claim 1, wherein the supporter portion includes:
    a chuck;
    a chuck rotating portion for rotating the chuck; and
    chucking pins for fixing the wafer edge and preventing the substrate from dropping out from the chuck when the supporter portion is rotated.

14. The apparatus as set forth in claim 13, wherein the chuck rotating portion includes:
    a chuck supporter for supporting the chuck; and
    a supporter driving portion for rotating the chuck supporter.

15. The apparatus as set forth in claim 14, further comprising a fluid injecting portion for injecting a fluid to the substrate lower portion placed on the supporter portion.

16. The apparatus as set forth in claim 15, wherein the fluid injecting portion includes:
    a fluid injecting hole formed in the center of the chuck; and
    a fluid supply pipe which supplies a fluid supplied from the fluid injecting hole and is disposed in the chuck supporter.

17. The apparatus as set forth in claim 1, performing an etching process.

18. An apparatus for manufacturing semiconductor devices, comprising:
    a rotation chuck on which a semiconductor substrate is placed;
    a nozzle for injecting a fluid to a substrate edge placed on the rotation chuck;
    a fluid supply pipe acting as a path of the fluid supplied to the nozzle;
    a nozzle moving portion for moving the nozzle; and
    a movable shielding cover for preventing the fluid injected from the nozzle from flowing to a shielding portion among a pattern-formed portion,
    wherein a lower portion of the shielding cover is opposite to the substrate and includes a protrusion formed at a portion corresponding to the edge of the shielding portion of the substrate and a cover portion for preventing the fluid injected to the substrate edge from splashing up.

19. The apparatus as set forth in claim 18, wherein the cover portion has a groove into which the nozzle is inserted.

20. The apparatus as set forth in claim 18, wherein the nozzle is inclined to the direction of the rotation of the rotation chuck.

* * * * *